United States Patent [19]

Stronski

[11] Patent Number: 4,761,568
[45] Date of Patent: Aug. 2, 1988

[54] LOAD-ADAPTED CLOCK GENERATOR IN CMOS CIRCUITS

[75] Inventor: Sabine Stronski, Goldach, Fed. Rep. of Germany

[73] Assignee: Siemens Aktiengesellschaft, Berlin and Munich, Fed. Rep. of Germany

[21] Appl. No.: 91,545

[22] Filed: Aug. 31, 1987

[30] Foreign Application Priority Data

Sep. 1, 1986 [DE] Fed. Rep. of Germany ....... 3629690

[51] Int. Cl.$^4$ .......................... H03K 5/13; H03K 5/00; H03K 3/01; H03K 3/284
[52] U.S. Cl. .................................... 307/269; 307/262; 307/279; 307/479; 307/510; 307/272 R; 307/272.1; 307/291; 328/57; 328/62
[58] Field of Search ............... 307/269, 279, 479, 510, 307/291, 292, 272 R, 272 A, 247 R, 276, 262; 377/106; 328/57, 62

[56] References Cited

U.S. PATENT DOCUMENTS

| | | | |
|---|---|---|---|
| 3,668,436 | 6/1972 | Bacon | 307/262 |
| 3,927,334 | 12/1975 | Callahan | 307/269 |
| 3,937,982 | 2/1976 | Nakajima | 307/452 |
| 3,961,269 | 6/1976 | Alvarez, Jr. | 307/262 |
| 4,039,862 | 8/1977 | Dingwall et al. | 307/247 R |
| 4,140,927 | 2/1979 | Feucht | 328/62 |
| 4,417,158 | 11/1983 | Ito et al. | 328/62 |
| 4,456,837 | 6/1984 | Schade, Jr. | 307/262 |
| 4,472,645 | 9/1984 | White | 307/279 |
| 4,540,904 | 9/1985 | Ennis et al. | 307/473 |
| 4,623,801 | 11/1986 | Rocchi | 307/279 |
| 4,625,126 | 11/1986 | Tinker et al. | 307/269 |

FOREIGN PATENT DOCUMENTS

2737544 2/1979 Fed. Rep. of Germany .

OTHER PUBLICATIONS

IBM Technical Disclosure Bulletin, vol. 22, No. 3, Aug. 1979, pp. 1093-1094.

Primary Examiner—Stanley D. Miller
Assistant Examiner—Trong Quang Phan
Attorney, Agent, or Firm—Herbert L. Lerner; Laurence A. Greenberg

[57] ABSTRACT

A clock generator for CMOS circuits for producing two non-overlapping internal clocks or timing cycles at two clock outputs, the clock generator having a frequency divider energized by an oscillator and having an output side, and a bistable multivibrator connected to the output side of the frequency divider and having complementary outputs includes an equal number of inverter-driver stages connected to each of the complementary outputs and being controllable thereby, the driver stages being dimensioned asymmetrically.

12 Claims, 1 Drawing Sheet

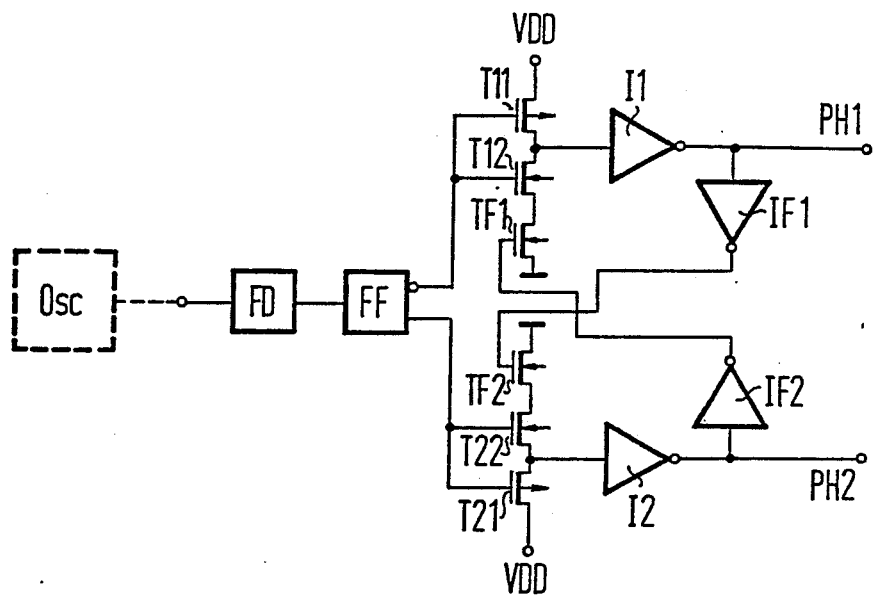

LOAD-ADAPTED CLOCK GENERATOR IN CMOS CIRCUITS

The invention relates to a clock generator for CMOS circuits for producing two non-overlapping internal clocks or timing cycles at two clock outputs, the clock generator having a frequency divider energized by an oscillator and having an output side, and a bistable multivibrator connected to the output side of the frequency divider and having complementary outputs.

The functional capability of digital circuits is based on a clock system which is generated with the aid of clock generators. Integrated circuits, in particular, often have an external clock or timing cycle, which is evaluated by an internal clock generator integrated with the component in order to generate an internal clock or timing cycle. For the various operating states of the integrated circuit, two internal clocks or timing cycles which do not overlap are often necessary, and they must never both be at a high level at the same time. Typically, these non-overlapping internal clocks or timing cycles are generated from the external clock or timing cycle by a frequency division.

It is conventional to provide a clock generator for generating the two non-overlapping internal clocks or timing cycles in the form of a flip-flop with symmetrically dimensioned output drivers, the flip-flop being triggered by the external clock or timing cycle via the frequency divider. Depending upon the complexity of the integrated circuit and upon the various operating states, many different lines must be charged by the internal clock generator. Because a capacitance can be physically associated with these lines, the capacitive load of the clock timing cycles generated by the clock generator consequently fluctuates. The load of a clock timing cycle can fluctuate by a factor of 15, for example, but the two clock timing cycles can also differ from one another by a multiple factor in terms of their maximum capacitive load.

An highly fluctuating capacitive load of this type of clock generator, however, can cause the clock timing cycles to be out of phase, in which case there is no longer any reliable assurance that the clock timing cycles will not overlap.

It is accordingly an object of the invention to provide a clock generator of the foregoing general type which does not generate overlapping clocks or timing cycles, even with different capacitive loads.

With the foregoing and other objects in view, there is provided in accordance with the invention, a clock generator for CMOS circuits for producing two non-overlapping internal clocks or timing cycles at two clock outputs, the clock generator having a frequency divider energized by an oscillator and having an output side, and a bistable multivibrator connected to the output side of the frequency divider and having complementary outputs, comprising an equal number of inverter-driver stages connected to each of the complementary outputs and being controllable thereby, the driver stages being dimensioned asymmetrically.

In accordance with another feature of the invention, the inverter-driver stages connected to each of the complementary outputs are connected to one another in series.

In accordance with an added feature of the invention, the dimensions of the driver stages are adapted to a maximum capacitive load to be driven thereby.

In accordance with an additional feature of the invention, the driver stages comprise transistors having a ratio of channel width to channel length which is different.

In accordance with another aspect of the invention, there is provided a clock generator for CMOS circuits for producing two non-overlapping internal clocks or timing cycles at two clock outputs, the clock generator having a frequency divider energized by an oscillator and having an output side, and a bistable multivibrator connected to the output side of the frequency divider and having complementary outputs respectively controlling an equal number of inverter-driver stages, comprising means for electrically interlocking at least one of the clock outputs with respect to the other.

In accordance with a further feature of the invention, a last one of the driver stages has the one clock output, and the electrical interlocking exists between the one clock output and a first one of the driver stages having the other clock output and being connected to one of the complementary outputs of the bistable multivibrator.

In accordance with again another feature of the invention, the electrical interlocking means comprise a locking transistor having an output circuit connected in series with output circuits of the inverter-driver stage to be interlocked, the locking transistor being controllably connected to the other clock output.

In accordance with again an additional feature of the invention there is provided an inverter via which the locking transistor is controllably connected to the other clock output.

In accordance with again an added feature of the invention, the locking transistor is of n-channel type and is connected by the output circuit thereof to a reference potential.

In accordance with again a further feature of the invention, the respective inverter-driver stage to be interlocked has a switching threshold higher than that of the other inverter-driver stages.

In accordance with still an added feature of the invention, the one clock output is an output most highly loaded capacitively, and the electrical interlocking means is a single locking device by which the one clock output locks the other of the clock outputs.

The clock generator according to the invention has the advantage that, with its asymmetrical output and driver stages, it can be adapted optimally to the circuit to be supplied, and thus occupies little space. It has the additional advantage that even with symmetrical output and driver stages, by means of the locking means, two non-overlapping clocks or timing cycles are assured by simple means, and there is the further advantage of redundancy, when various features of the invention are combined to provide, in accordance with the invention, a clock generator for CMOS circuits for producing two non-overlapping internal clocks or timing cycles at two clock outputs, the clock generator having a frequency divider energized by an oscillator and having an output side, and a bistable multivibrator connected to the output side of the frequency divider and having complementary outputs, comprising an equal number of inverter-driver stages connected to each of the complementary outputs and being controllable thereby, the inverter driver stages being dimensioned asymmetrically and having dimensions adapted to a maximum capacitive load to be driven thereby, the inverter-driver stages comprising transistors having a ratio of channel width to channel length which is different, and including means for electrically interlocking at least one of the clock outputs with respect to the other, a last one of the inverter-driver stages having the one clock output, and the electrical interlocking existing between the one clock output and a first one of the inverter-driver stages having the other clock output and being connected to one of the complementary outputs of the bistable multivibrator, the electrical interlocking means comprising a locking transistor having an output circuit connected in series with output circuits of the inverter-driver stage to be interlocked, and being controllably connected to the other clock output, the locking transistor being of n-channel type and being connected by the output circuit thereof to a reference potential, and the respective inverter-driver stage to be interlocked having a switching threshold higher than that of the other inverter-driver stages.

Other features which are considered as characteristic for the invention are set forth in the appended claims.

Although the invention is illustrated and described herein as embodied in load-adapted clock generator in CMOS circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single FIGURE of the drawing which is a circuit diagram of the clock generator according to the invention.

Referring now to the FIGURE of the drawing, there is shown therein a circuit of a clock generator according to the invention wherein an external clock or timing cycle is supplied conventionally by an external oscillator Osc, and is divided internally by a frequency divider FD to one-half the frequency. The output of the frequency divider FD then controls a flip-flop FF, which has complementary outputs, so that two non-overlapping clock signals are available. These output signals of the flip-flop FF are not sufficient, however, to control the integrated circuit, because this circuit, with its lines, represents a capacitive load for which the output current of the flip-flop FF is insufficient. The outputs of the flip-flop FF are therefore each followed or post-connected by an equal number of inverter-driver circuits, shown in the exemplary embodiment as two inverter-driver circuits T11, T12, I1, T21, T22, I2 connected in series but usually more than two, which provide a corresponding output current to the clock outputs PH1 and PH2 of the clock generator. The number of inverter-driver stages required for each clock or timing cycle depends upon the intensity of the required current; a multi-stage output driver, when compared with a single-stage output driver, assures that, for a like current, the steepness of the edges of the clock signal pulses will largely be maintained without change. The required output currents are derived from the available clock period and the respective capacitance to be charged.

In accordance with the invention, the output driver stages are adapted to the different loads. With a plurality of driver stages connected in series, the output driver stages can be dimensioned so that the overall result is an asymmetrical output current that is adapted to the capacitive load to be driven. It is advantageous to dimension the driver stages so that they are each adapted to the maximum capacitive load to be driven.

The dimensioning of the driver stages, especially with the CMOS technology of the exemplary embodiment, is effected with the aid of the dimensioning of the MOS transistors of the p-channel or n-channel type. The dimensioning of the transistors relates not only to the dimensioning of the individual driver stages for each clock or timing cycle, but also to the dimensioning of the individual transistors of one driver stage. Typically, the dimensioning is effected by means of the ratio or relationship of the channel width to the channel length of the individual transistors. Thus, it can also be taken into consideration that MOS transistors of the p-channel type become conductive more slowly than do MOS transistors of the n-channel type, so that even with very steep pulse edges, optimal load adaptation occurs. At the same time, the input level, i.e. the level at which the driver stages switch over from one logical state to another logical state, can be adapted optimally to the load ratios at the clock outputs, by means of the ratio or relationship of the channel widths of the p-channel transistor and of the n-channel transistor.

Another way in which the aforementioned object can be attained is to interlock one or both clock outputs electrically with respect to one another. This interlocking is preferably effected from the output of the last driver stage, which forms the clock output, to the first driver stage, which is associated with the other clock output and is connected to the output side of the bistable multivibrator or flip-flop FF. As shown in the FIGURE of the drawing, a mutual interlocking of the clock outputs with respect to one another is provided in the exemplary embodiment.

To this end, in the exemplary embodiment, one locking transistor TF1 and TF2, respectively, is connected in series with the transistors T11, T12 and T21, T22, respectively. The transistors TF1 and TF2 are preferably of the n-channel type and thus have their output circuit located between an output of the n-channel transistor T12 and T22, respectively, of the respective inverter stage and the reference potential. n-channel transistors are faster than p-channel transistors, and thus they can switch the respective inverter on or off with maximum speed.

The gates of the transistors T11 and T12 are controlled by the inverting output of the flip-flop FF, while the gates of the transistors T21 and T22 are controlled by the non-inverting output of this flip-flop FF. In a second inverter stage, the inverters I1 and I2, respectively, the outputs of which form the clock outputs PH1 and PH2, respectively, are connected to the respective outputs of the inverter stages at the junctions of the output circuits of the transistors T11 and T12, on the one hand, and at the junctions of the output circuits of the transistors T21 and T22, on the other hand. The control terminal of the transistor TF1 is then controlled by the clock output PH2, while the control input of the transistor TF2 is controlled by the clock output PH1. In the exemplary embodiment shown in the drawing, one inverter IF1 and IF2, respectively, must be disposed between the respective clock output and the control input of the respective locking transistor in order to assure the functioning of the circuit.

The switching point of the respective inverter-driver stage to be locked, i.e. the inverter-driver stages T11 and T12, on the one hand, and T21 and T22, on the other hand, in the exemplary embodiment, is advantageously high when compared with inverter-driver stages without interlocking. This provision or measure is achieved by dimensioning the ratio of the channel width to the channel length of the p-channel and n-channel transistor types, and is within the competence of any person having ordinary skill in the art. Because of this provision or measure and the interlocking, the clocks or timing cycles cannot intersect one another, yet very little time is lost, because there is very little time when one or the other of the clocks or timing cycles is not at high potential.

In accordance with the invention, it is also possible not to interlock both clock inputs with respect to one another as in the exemplary embodiment but instead to interlock only one clock output with respect to the other. Advantageously, the clock output most highly loaded capacitively is then interlocked with respect to the other clock output, so that this other clock output cannot assume a high potential until the other, most highly loaded clock output has already departed from this potential. In each case, the circuit according to the invention can be optimized as intended by establishing the switching thresholds of the interlocking transistors TF1 and TF2 or of the inverters IF1 or IF2 connected to the input sides thereof.

A third possibility for attaining the object of the invention is to combine the foregoing two possibilities, i.e. both an asymmetric dimensioning of the inverter-driver stages and an interlocking of one or both clock outputs with respect to the other clock output can be provided.

The foregoing is a description corresponding in substance to German application No. P 36 29 690.2, dated Sept. 1, 1986, the International priority of which is being claimed for the instant application, and which is hereby made part of this application. Any material discrepancies between the foregoing specification and the aforementioned corresponding German application are to be resolved in favor of the latter.

I claim:

1. Clock generator for CMOS circuits for producing two non-overlapping internal clocks or timing cycles at two clock outputs, the clock generator having a frequency divider energized by an oscillator and having an output side, and a bistable multivibrator connected to the output side of the frequency divider and having complementary outputs, comprising an equal number of inverter-driver stages connected to each of the complementary outputs and being controllable thereby, said driver stages being dimensioned asymmetrically.

2. Clock generator according to claim 1 wherein the inverter-driver stages connected to each of the complementary outputs are connected to one another in series.

3. Clock generator according to claim 1, wherein the dimensions of said inverter-driver stages correspond to a maximum capacitive load to be driven thereby.

4. Clock generator according to claim 1, wherein said inverter-driver stages comprise transistors having a ratio of channel width to channel length which is different.

5. Clock generator for CMOS circuits for producing two non-overlapping internal clocks or timing cycles at two clock outputs, the clock generator having a frequency divider energized by an oscillator and having an output side, and a bistable multivibrator connected to the output side of the frequency divider and having complementary outputs respectively controlling an equal number of inverter-driver stages, comprising means for electrically interlocking at least one of the clock outputs with respect to the other.

6. Clock generator according to claim 5, wherein a last one of said inverter-driver stages has said one clock output, and said electrical interlocking means exists between said one clock output and a first one of said inverter-driver stages having said other clock output and being connected to one of the complementary outputs of the bistable multivibrator.

7. Clock generator according to claim 5, wherein said electrical interlocking means comprise a locking transistor having an output circuit connected in series with output circuits of the inverter-driver stage to be interlocked, said locking transistor being controllably connected to said other clock output.

8. Clock generator according to claim 7, including an inverter via which said locking transistor is controllably connected to said other clock output.

9. A clock generator as defined by claim 7, wherein said locking transistor is of n-channel type and is connected by said output circuit thereof to a reference potential.

10. Clock generator as defined by claim 7, wherein the respective inverter-driver stage to be interlocked has a switching threshold higher than that of the other inverter-driver stages.

11. Clock generator according to claim 5, wherein said one clock output is an output most highly loaded capacitively, and said electrical interlocking means is a single locking device by which said one clock output locks the other of said clock outputs.

12. Clock generator for CMOS circuits for producing two non-overlapping internal clocks or timing cycles at two clock outputs, the clock generator having a frequency divider energized by an oscillator and having an output side, and a bistable multivibrator connected to the output side of the frequency divider and having complementary outputs, comprising an equal number of inverter-driver stages connected to each of the complementary outputs and being controllable thereby, said inverter driver stages being dimensioned asymmetrically and having dimensions corresponding to a maximum capacitive load to be driven thereby, said inverter-driver stages comprising transistors having a ratio of channel width to channel length which is different, and including means for electrically interlocking at least one of the clock outputs with respect to the other, a last one of said inverter-driver stages having said one clock output, and said electrical interlocking means existing between said one clock output and a first one of said inverter-driver stages having said other clock output and being connected to one of the complementary outputs of the bistable multivibrator, said electrical interlocking means comprising a locking transistor having an output circuit connected in series with output circuits of the inverter-driver stage to be interlocked, and being controllably connected to said other clock output, said locking transistor being of n-channel type and being connected by said output circuit thereof to a reference potential, and the respective inverter-driver stage to be interlocked having a switching threshold higher than that of the other inverter-driver stages.

* * * * *